US005956060A

United States Patent [19]

Zaba et al.

[11] Patent Number: 5,956,060

[45] Date of Patent: Sep. 21, 1999

[54] ELECTRODE ASSEMBLY ON A FLEXIBLE NON-CONDUCTIVE FILM FOR A CONTINUOUS INK JET PRINTER

[75] Inventors: Jerzy Marcin Zaba; Danny Charles Palmer; Caroline Louise Wallace, all of Cambridge, United Kingdom

[73] Assignee: Domino Printing Sciences PLC, United Kingdom

[21] Appl. No.: 08/397,788

[22] Filed: Mar. 3, 1995

[30] Foreign Application Priority Data

Mar. 10, 1994 [GB] United Kingdom .................. 9404741

[51] Int. Cl.[6] ................................ B41J 2/085; B41J 2/14; H05K 3/00

[52] U.S. Cl. ................................ 347/76; 29/829; 347/50

[58] Field of Search .............................. 347/76, 208, 50, 347/85, 55, 49, 210, 201; 439/55, 77; 29/611, 890.1, 829; 174/254; 361/791

[56] References Cited

U.S. PATENT DOCUMENTS

| | | | |
|---|---|---|---|
| 4,047,184 | 9/1977 | Bassous et al. | 347/76 |
| 4,347,522 | 8/1982 | Bahl et al. | 347/75 |
| 4,423,425 | 12/1983 | Reese et al. | 347/201 |
| 4,427,986 | 1/1984 | Iyoda et al. | 347/75 |
| 4,506,272 | 3/1985 | Arai | 347/210 |
| 4,560,991 | 12/1985 | Schutrum | 347/76 |
| 4,651,163 | 3/1987 | Sutera et al. | 347/75 |
| 4,774,527 | 9/1988 | Hancock et al. | 347/208 |
| 4,928,116 | 5/1990 | Wood | 347/75 |
| 5,173,392 | 12/1992 | Miersch et al. | 430/311 |

FOREIGN PATENT DOCUMENTS

| | | | |
|---|---|---|---|
| 0562308A2 | 9/1993 | European Pat. Off. . | |
| 94301322 | 2/1994 | European Pat. Off. . | |
| 0 593 175 | 4/1994 | European Pat. Off. | 347/50 |
| 95 30 1184 | 11/1996 | European Pat. Off. . | |
| 358096571 | 6/1983 | Japan | B41J 3/16 |

*Primary Examiner*—N. Le
*Assistant Examiner*—Thien Tran
*Attorney, Agent, or Firm*—Latiff, Whitesel, Conte & Saret, Ltd.

[57] ABSTRACT

A method of making an electrode assembly for a continuous ink jet printer. The method includes disposing a plurality of conductive tracks side by side on a flexible non-conductive film, each of said conductive tracks having an electrode portion, a conductor portion and a connector portion. The film is mounted on a support block with the electrode portion of each conductive track disposed at an end surface of the block.

20 Claims, 5 Drawing Sheets

ELECTRODE ASSEMBLY ON A FLEXIBLE NON-CONDUCTIVE FILM FOR A CONTINUOUS INK JET PRINTER

The present invention relates to continuous ink jet printers, i.e. those in which a continuous stream or streams of droplets are produced, individual droplets within the stream or streams being selectively charged and then deflected to a print position as required.

Continuous ink jet printers of the single nozzle type are very well known, but less common are continuous ink jet printers having plural nozzles and therefore plural continuous streams of droplets. The present invention is particularly directed to multi jet printers and in particular is directed to the construction of electrodes for use in such printers.

In a multi jet continuous ink jet printer each stream of droplets requires a related charge electrode and usually a corresponding phase detector electrode (used to detect correct charging of droplets). Various techniques have been proposed for manufacturing multiple, closely-spaced, charged electrodes, see for example the U.S. Pat. No. 4,928,116, U.S. Pat. No. 4,928,113, and U.S. Pat. No. 4,560,991. These techniques involve electro-plating the electrodes in a defined pattern onto a copper foil sheet, through a photoresist, removing the photoresist, bending the composite sheet and plated electrodes, moulding a dielectric around the electrodes and thereafter removing the copper foil sheet to expose the electrodes within the moulded dielectric. It will be appreciated that such a method is time consuming, since it involves a number of different steps in the manufacturing process, but, significantly, in practice, the yield (i.e. the percentage of usable electrode assemblies formed) is relatively low and thus manufacturing costs are high.

There is a need for a method of making an electrode assembly for a continuous ink jet printer which involves fewer and simpler steps and which enables a greater yield, in order to reduce manufacturing costs, whilst at the same time providing an improvement in the assembly structure.

According to the present invention there is provided a method of making an electrode assembly for a continuous ink jet printer, the method comprising providing a flexible non-conductive film; disposing on the film, side by side, a plurality of conductive tracks each having an electrode portion, a conductor portion and a connector portion; and thereafter mounting the film on a support block with the electrode portions of said conductive tracks disposed at an end surface of the block.

The invention also includes an electrode assembly for a continuous ink jet printer, the assembly comprising a flexible non-conductive film; a plurality of conductive tracks disposed side by side on the film, each having an electrode portion, a conductor portion and a connector portion; and the film being mounted on a support block with the electrode portions of said conductive tracks disposed at an end surface of the block.

Preferably, the film comprises an elongate strip and the electrode portions of the tracks are disposed substantially centrally along its length, with the conductor portions extending along the strip from one end or the other of the electrode portions to connector portions at one or the other end of the strip. By this means, adjacent connector portions can be arranged at a greater spacing pitch than the electrode portions for improved connection. Alternate conductor portions may extend from opposite ends of the respective electrode portions or else alternate groups of conductor portions may extend from opposite ends of the respective electrode portions.

To improve connection further, the conductor portions and connector portions may not only have a greater pitch, but may be wider than the electrode portions. It will be appreciated that by using both ends of the strip for connector portions, and thus halving the number on each side of the electrode portions, the connector and conductor portions may occupy twice the width of the electrode portions. In particular, increasing the spacing between tracks may also serve to reduce crosstalk between adjacent conductive tracks in use.

The conductive tracks may be formed by electrode plating copper laminate onto a flexible substrate such as polyimide and thereafter creating a pattern of electrode, conductor and connector portions using conventional techniques such as chemical etching or by, for example laser abrasion, if a greater resolution is required. The conductive tracks are preferably thereafter coated or encapsulated over the majority of their area, leaving uncoated a central portion over the electrodes and end portions over the connector portions. The exposed portions may be further plated with other metals such as gold, for corrosion protection, if desired and/or may be coated with a dielectric material of controlled resistivity to achieve desired electric charge dissipation.

Mounting the film to the support block involves folding and bonding the film onto a metal or other former in such a way that the electrode portions are placed on the outside of the fold and are located against a flat end edge of the support block.

If desired, alternate conductive tracks may form shielding tracks to the conductive tracks used to provide voltages to the electrodes for charging the droplets, the shielding conductors being, if desired, of narrower width in order to reduce increases in the pitch between adjacent charging electrodes.

Furthermore, if desired, a pair of charge electrode assemblies as described above, may be mounted in opposition to one another, with adjacent electrodes on the same electrode assembly being oppositely charged or being alternately charged and grounded and opposite electrodes being similarly oppositely charged or grounded. Such a technique can be used to improve charging of individual droplets and reduce crosstalk.

An electrode assembly according to the present invention may also be employed as a phase detector electrode assembly or the like.

One example of a charge electrode assembly according to the present invention will now be described with reference to accompanying drawings in which.

Figure 1:
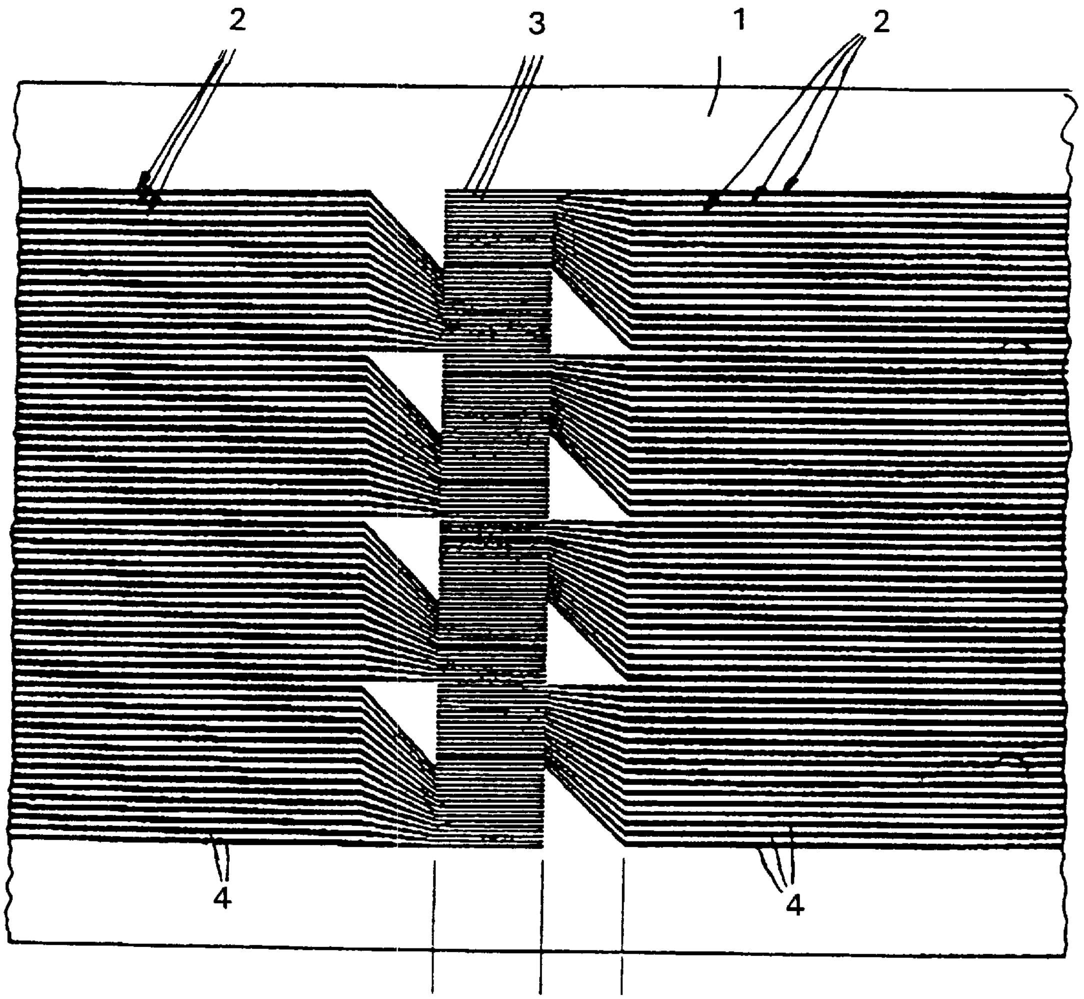
FIG. 1 is a partial planar view of the assembly.

FIG. 1 shows a portion, in planar view, of a non-conductive film 1 of polyimide on which are formed plural conductive tracks 2, by first electrode depositing a thin layer of copper and then etching away portions of the copper through a mask (not shown) to leave the conductive tracks 2. At a central portion of the film 1, i.e. centrally of its length, the conductive tracks form individual electrodes 3 which are disposed at the desired pitch corresponding to the pitch of the nozzles in a multi-nozzle continuous ink jet printer printhead. It can be seen that the conductive tracks extend away from the electrode portions 3 on opposite sides, in groups. This enables the conductive tracks to be of a greater width and of a greater spacing than the electrodes 3 which is useful, particularly at the ends of the film where the conductive tracks form connecting portions for connection of the electrode assembly to the charging electronics of the printer. In the example the conductive tracks are shown extending away from the electrode portions in groups, but it will be appreciated that alternative configurations are possible, for example, alternate conductive tracks extending on opposite sides.

Figure 2:
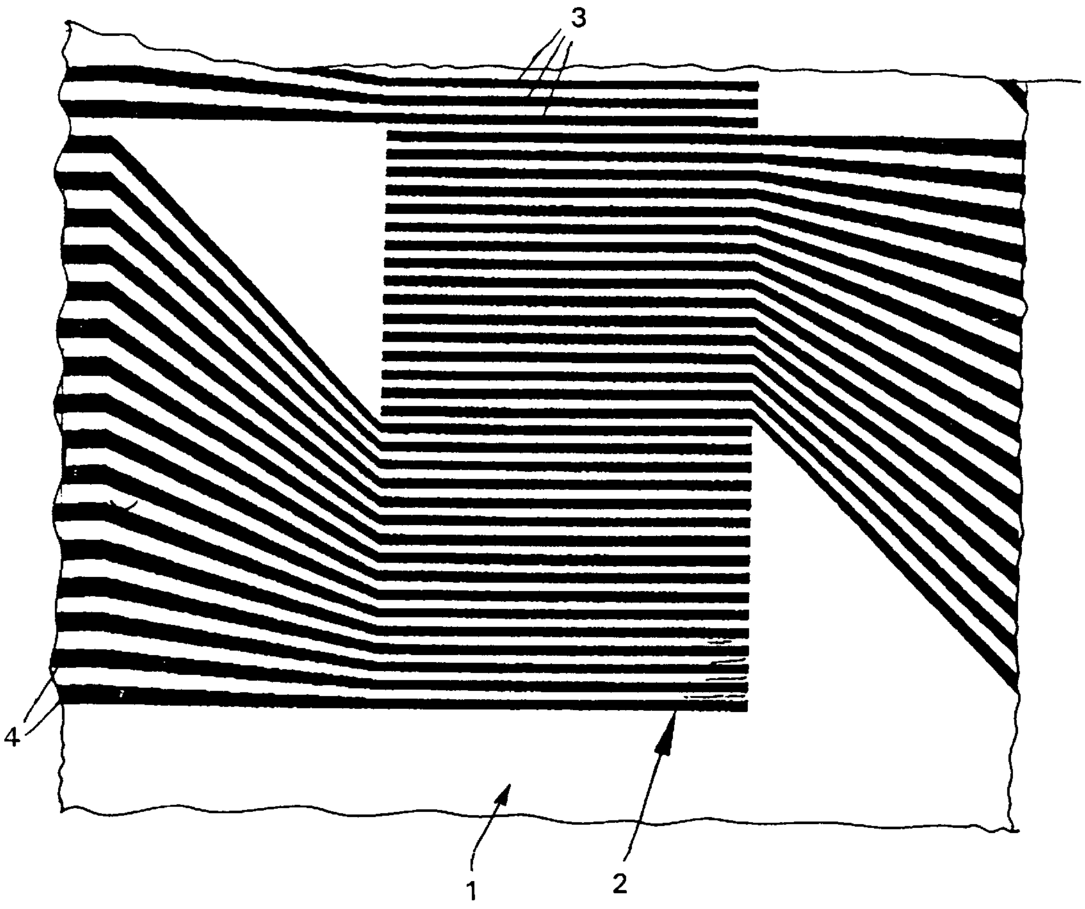
FIG. 2 is a further partial planar view on a greater scale.

FIG. 2 shows a smaller central portion of the film and conductive tracks in more detail. In the example the electrode portions of the conductive tracks have a width of 100 $\mu$m, with a 100 $\mu$m gap, the conductive track being deposited to a thickness of 15 $\mu$m. The conductor portions 4 have a width of 200 $\mu$m and a spacing of 200 $\mu$m.

Figure 3:
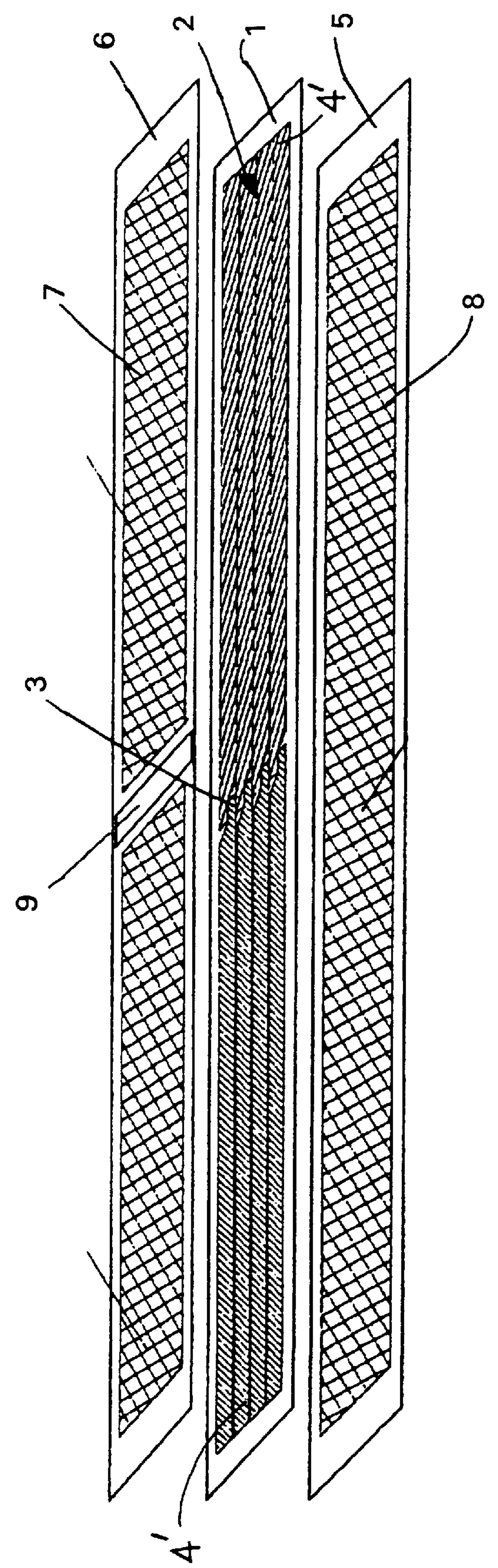
FIG. 3 illustrates a laminated construction of the film from which the assembly is manufactured.

FIG. 3 shows a film 1 with conductive tracks 2 and, above and below, additional non-conductive films 5, 6, on each of which is disposed, in a grid arrangement, a plurality of copper tracks 7, 8 which, in use, are electrically grounded and form electrical shields to the conductive tracks 2, to reduce crosstalk and noise. The film 6 has a window 9 cut through it which, when the films 5 and 6 are bonded (by means of a suitable epoxy adhesive) to the film 1, lies over the electrode portions 3 of the conductive tracks 2 and the end portions of the film 6 are left free of shielding conductors 7 in order to enable the ends of the conductive tracks 2 to form connector portions 4'.

Figure 4:
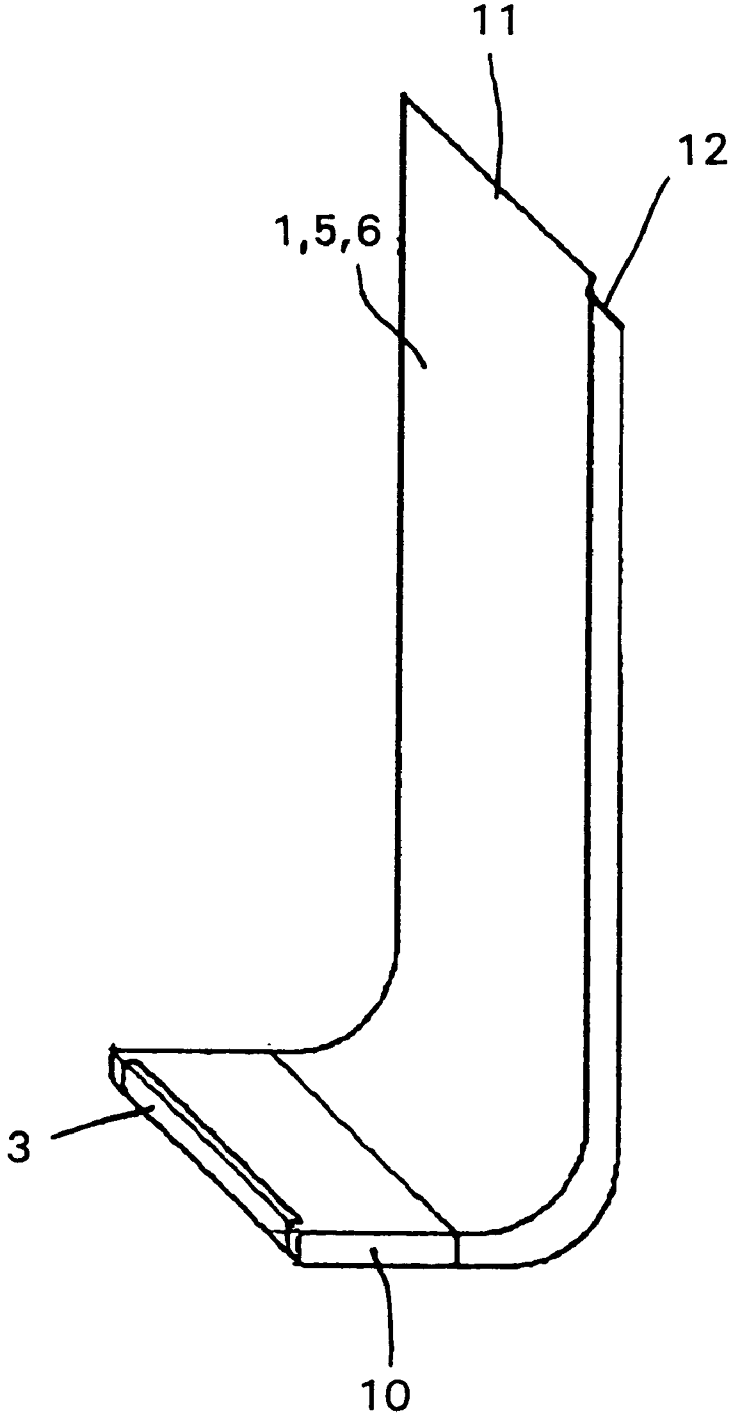
FIG. 4 illustrates a completed electrode assembly.

FIG. 4 shows the assembled electrode assembly, the assembled films 1, 5, 6, carrying the conductive tracks, being folded around and adhesively mounted to a metal support block 10, at one edge of which the exposed electrode portions 3 are disposed. The flexible nature of the films 1, 5, 6 enable the electrode assembly to be mounted as desired with connections being made remotely from the electrode assembly at the ends 11, 12 of the films carrying the conductor tracks.

Figure 5:
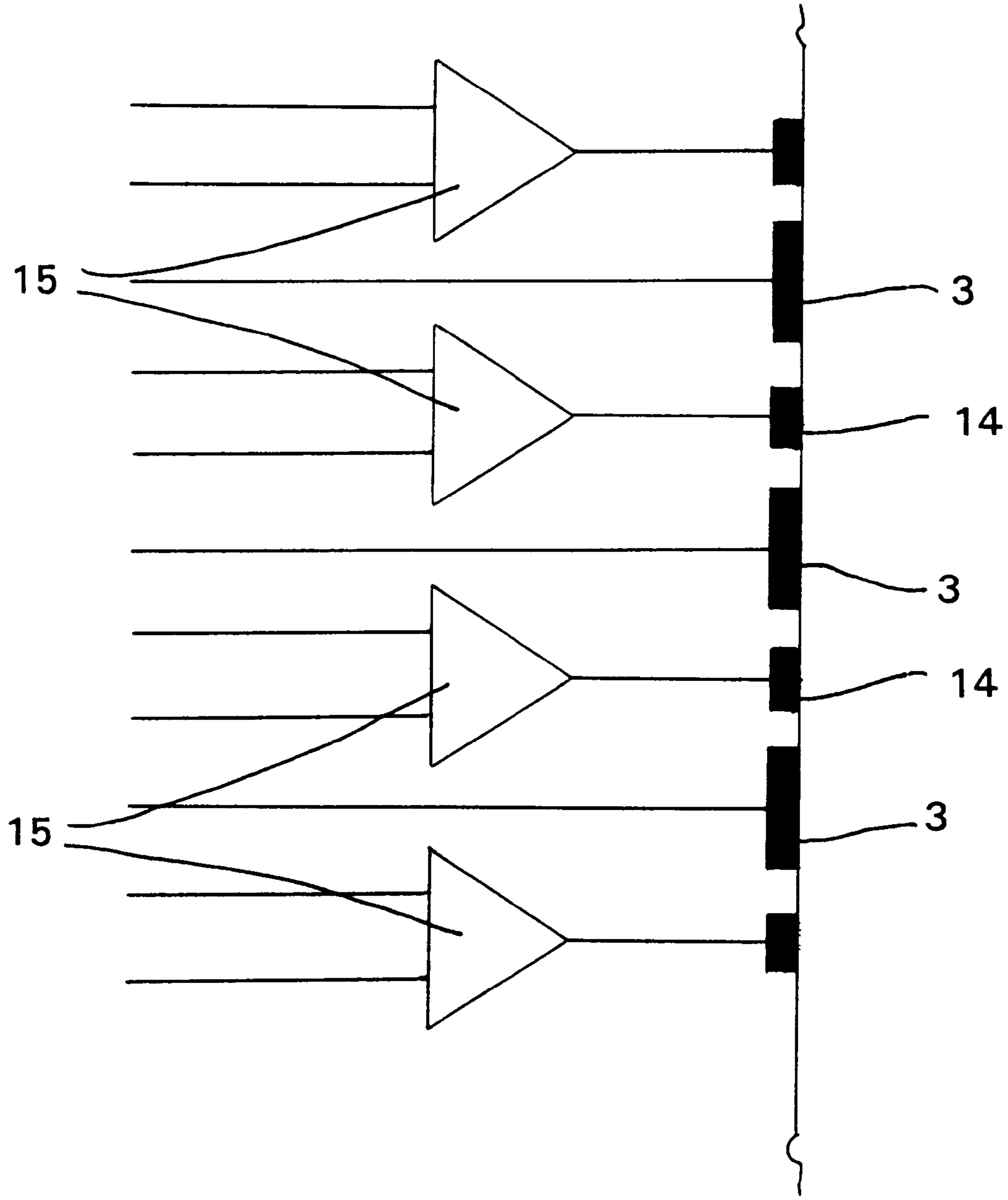
FIG. 5 illustrates, diagrammatically, an electrode arrangement for reducing cross-talk.

FIG. 5 illustrates an arrangement of electrodes which may be used, where necessary, to protect individual charging electrodes from cross-talk. The Figure is a diagrammatic one and illustrates a number of charge electrodes 3 which are separated by interstitial, guard electrodes 14. It will be appreciated that these interstitial electrodes can either be on the same electrode structure as the charge electrodes or may be on an entirely separate electrode structure. They may be narrower than the charging electrodes as shown in the drawing.

In operation a single "charge signal" sent to a particular charge electrode 3 is altered by suitable electronics to provide the following simultaneous signals.

1. A $+V_{charge}$ to the relevant charge electrode 3;
2. A $-kV_{charge}$ compensating opposite charge to the interstitial electrode 14 to one side of the charge electrode 3; and,
3. A $-kV_{charge}$ to the interstitial electrode on the other side of the charge electrode.

The signals 2 and 3 thus protect neighbouring electrodes from picking up any of the charge not intended for them thus protecting neighbouring droplet streams from erroneous charging. The voltage levels can be set at a predetermined level which would be factory set to compensate for cross-talk.

Since each interstitial electrode has two neighbouring charge electrodes 3, even if both jets on each side of a particular guard electrode 14 are to be charged, the interstitial electrode need only receive one charge and therefore an OR gate 15 is used on the input to each interstitial electrode so that it is appropriately charged if one or the other or both of the adjacent charge electrodes is actuated.

In an alternative construction (not shown) the interstitial electrodes are disposed on the opposite side of the droplet streams to the charging electrodes.

We claim:

1. A method of making an electrode assembly for a continuous ink jet printer, the method comprising the following steps: providing a flexible non-conductive film; disposing a plurality of continuous conductive tracks side by side on the film, each of said continuous conductive tracks having as part of its continuous structure an electrode portion, a conductor portion and a connector portion; and thereafter mounting the film on a support block with the electrode portion of each of said conductive tracks disposed at an end surface of the block.

2. A method according to claim 1, wherein the step of disposing said plurality of conductive tracks on said film includes disposing the electrode portion of each of said tracks substantially centrally along a length of said non-conductive film, with the conductor portion of each of said tracks extending along the film from one end or another end of a respective electrode portion to a respective connector portion at one end or the other end of the film.

3. A method of making an electrode assembly for a continuous ink let printer, the method comprising the following steps: providing a flexible non-conductive film; disposing a plurality of conductive tracks side by side on the film, each of said conductive tracks having an electrode portion, a conductor portion and a connector portion;

disposing the electrode portion of each of said tracks substantially centrally along a length of said non-conductive film, with the conductor portion of each of said tracks extending along the film from one end or another end of a respective electrode portion to a respective connector portion at one end or the other end of the film;

disposing alternate conductor portions to extend from opposite ends of said electrode portions;

and thereafter mounting the film on a support block with the electrode portion of each of said conductive tracks disposed at an end surface of the block.

4. A method according to claim 3, wherein the step of disposing said plurality of conductive tracks includes disposing alternate groups of conductor portions to extend from opposite ends of said electrode portions.

5. A method according to any of claims 1 to 4, wherein the step of disposing said plurality of conductive tracks on said film includes forming the conductor portions and connector portions wider than the electrode portions.

6. A method according to claim 1, wherein the step of disposing the plurality of conductive tracks on said film includes electro-plating copper onto a flexible substrate and thereafter forming a pattern of electrode, conductor and connector portions.

7. A method according to claim 6, further comprising the step of coating or encapsulating a majority portion of each conductive track and leaving uncoated a central portion of the electrode of each conductive track and an end portion of the connector portion of each conductive track.

8. A method according to claim 7, further comprising the step of plating the uncoated portions with metals other than copper.

9. A method according to claim 7 or 8, further comprising the step of coating the uncoated portions with a dielectric material of controlled resistivity to achieve desired electric charge dissipation.

10. A method according to claim 1, wherein the step of mounting the film includes: folding and bonding the film onto a metal or other former in such a way that the electrode portions are placed on an outside of a fold and are located against a flat end edge of the support block.

11. An electrode assembly for a continuous ink jet printer, the assembly comprising: a flexible non-conductive film; a plurality of continuous conductive tracks disposed side by side on the film; each of said continuous conductive tracks having as part of its continuous structure an electrode portion, a conductor portion and a connector portion; and the film being mounted on a support block with the electrode portion of each of said conductive tracks disposed at an end surface of the block.

12. An electrode assembly according to claim 11, wherein the film comprises an elongate strip and the electrode portion of each of said tracks is disposed substantially centrally along the strip's length, with the conductor portion of each of said tracks extending along the strip from one end or another end of a respective electrode portion to a respective connector portion at one end or the other end of the strip.

13. An electrode assembly according to claim 11, wherein the conductive tracks are an electro-plated copper laminate on a flexible substrate forming a pattern of electrode, conductor and connector portions.

14. An electrode assembly according to claim 13, wherein a majority portion of each conductive track is coated or encapsulated, leaving uncoated a central portion of the electrode of each conductive track and an end portion of the connector portion of each conductive track.

15. An electrode assembly according to claim 14, wherein the uncoated portions are plated with metals other than copper.

16. An electrode assembly according to claim 14 or 15, wherein the uncoated portions are coated with a dielectric material of controlled resistivity to achieve desired electric charge dissipation.

17. An electrode assembly for a continuous ink jet printer, the assembly comprising: a flexible non-conductive film; a plurality of conductive tracks disposed side by side on the film; each of said conductive tracks having an electrode portion, a conductor portion and a connector portion, wherein the film comprises an elongate strip and the electrode portion of each of said conductive tracks is disposed substantially centrally along the strip's length. with the conductor portion of each of said tracks extending along the strip from one end or another end of a respective electrode portion to a respective connector portion at one end or the other end of the strip; and wherein alternate conductor portions extend from opposite ends of said electrode portions, and wherein the film is mounted on a support block with the electrode portion of each of said conductive tracks disposed at an end surface of the block.

18. An electrode assembly according to claim 17, wherein alternate groups of conductor portions extend from opposite ends of said electrode portions.

19. An electrode assembly according to any of claims 11, 12, 17, or 18 wherein the conductor portions and connector portions are wider than the electrode portions.

20. A method of making an electrode assembly for a continuous ink jet printer, the method comprising the following steps:

providing a flexible non-conductive film;

disposing a plurality of conductive tracks'side by side on the film, each of said conductive tracks having an electrode portion, a conductor portion and a connector portion, forming the conductor portions and connector portions wider than the electrode portions;

and thereafter mounting the film on a support block with the electrode portion of each of said conductive tracks disposed at an end surface of the block.

* * * * *